United States Patent [19]
Tuttle et al.

[11] Patent Number: 5,983,363
[45] Date of Patent: Nov. 9, 1999

[54] IN-SHEET TRANSCEIVER TESTING

[75] Inventors: Mark E. Tuttle, Boise; Rickie C. Lake, Eagle; Steven F. Schicht; John R. Tuttle, both of Boise, all of Id.

[73] Assignee: Micron Communications, Inc., Boise, Id.

[21] Appl. No.: 08/306,906

[22] Filed: Sep. 15, 1994

Related U.S. Application Data

[63] Continuation-in-part of application No. 07/979,607, Nov. 20, 1992.

[51] Int. Cl.$^6$ .............................. G06F 11/00; G01R 31/00
[52] U.S. Cl. ............................................. 714/25; 324/605
[58] Field of Search ....................... 437/8, 51; 371/15.1, 371/22.1; 324/605, 606; 714/25

[56] References Cited

U.S. PATENT DOCUMENTS

| | | | |
|---|---|---|---|
| 4,704,734 | 11/1987 | Menich et al. | 455/33 |
| 4,996,715 | 2/1991 | Marui et al. | 455/33 |
| 5,068,521 | 11/1991 | Yamaguchi | 395/800 |
| 5,087,920 | 2/1992 | Tsurumaru et al. | 343/700 |
| 5,113,184 | 5/1992 | Katayama | 340/825.54 |
| 5,149,662 | 9/1992 | Eichelberger | 437/8 |
| 5,198,647 | 3/1993 | Mizuta | 235/449 |
| 5,212,373 | 5/1993 | Fujioka et al. | 235/492 |
| 5,252,914 | 10/1993 | Bobbitt et al. | 324/158 S |
| 5,279,975 | 1/1994 | Devereaux et al. | 437/8 |
| 5,315,241 | 5/1994 | Ewers | 324/158.1 |
| 5,349,139 | 9/1994 | Verrier et al. | 178/19 |
| 5,434,394 | 7/1995 | Roach et al. | 235/375 |
| 5,455,575 | 10/1995 | Schuermann | 342/42 |

*Primary Examiner*—Robert W. Beausoliel, Jr.
*Assistant Examiner*—Scott T. Baderman
*Attorney, Agent, or Firm*—William R. Bachand; Robert J. Stern

[57] ABSTRACT

A plurality of battery-operated transceivers encapsulated by lamination to form a sheet of independent transceivers is tested in a two piece fixture that forms an enclosure surrounding each in-sheet transceiver. Each enclosure has an antenna for transmitting a command signal to the transceiver at a known power level and for receiving a reply message from the transceiver containing a power level measurement made by the transceiver. Test methods using the fixture of the present invention are also described.

5 Claims, 3 Drawing Sheets

IN-SHEET TRANSCEIVER TESTING

CROSS REFERENCE TO RELATED APPLICATIONS

This application is a continuation in part of and claims priority from U.S. patent application Ser. No. 07/979,607 filed Nov. 20, 1992.

FIELD OF THE INVENTION

This invention relates to transponder testing and to test systems, fixtures, and methods for testing transponders.

BACKGROUND OF THE INVENTION

As an introduction to the problems solved by the present invention, consider the conventional transponder used for radio frequency identification (RFID). Such a transponder includes a radio transceiver with a built-in antenna for receiving command message signals and for transmitting reply message signals. Inexpensive transponders find application in systems for tracking material, personnel, and animals, inventory management, baggage handling, and the mail to name a few major areas.

A transponder necessarily includes a transceiver. Such transponders may include an integrated circuit transceiver, a battery, and a printed circuit antenna hermetically encapsulated in a laminated package about 1 inch square and approximately as thick as a mailing label or tag. In such a laminated package, manufacturing acceptance tests on each unit become difficult and costly.

Conventional transponders are inexpensively manufactured in sheets having for example 250 integrated circuit transceivers spaced apart in a row and column array between polymer films. Prior to use, the transponders are separated from each other by shearing the sheet between adjacent rows and columns. Conventional testing methods and apparatus cannot be used until the transponders are separated from each other.

Conventional manufacturing acceptance tests for transponders are based in part on antenna performance tests that simulate the application in which the transponder will be used. These so called "far-field" tests require a large anechoic chamber and individual testing of a single transponder at a time. Such far-field testing adds significantly to the per unit cost of inexpensive transponders.

Without inexpensive transponder testing for manufacturing acceptance tests, incomplete testing may perpetrate unreliable tracking, inventory, and handling systems, increase the cost of maintaining such systems, and discourage further development and popular acceptance of transponder technology.

In view of the problems described above and related problems that consequently become apparent to those skilled in the applicable arts, the need remains in transponder testing for more accurate and Less costly test systems, fixtures, and test methods.

SUMMARY OF THE INVENTION

Accordingly, a test system in one embodiment of the present invention includes a fixture, an interrogator, and a switch cooperating for testing a sheet containing a plurality of transceivers, each transceiver within a contour on the sheet. The fixture, in one embodiment, admits a sheet of transceivers and surrounds each transceiver at its contour so that each transceiver is respectively enclosed within an enclosure. Within each enclosure is an antenna for so called "near-field" communication. The interrogator determines a command signal and evaluates reply signals from each transceiver. The switch is coupled in series between each antenna and the interrogator for selecting an antenna for transmitting the command signal and for receiving the reply signal.

According to a first aspect of such an embodiment, the fixture isolates transceivers from each other so that multiple transceivers are tested simultaneously. By isolating each transceiver, interference from adjacent transceivers is minimized, transponder identity and location are not confused, and test transmissions are prevented from affecting external equipment including other test stations.

According to another aspect, testing is facilitated by isolating each transceiver at its contour.

According to another aspect, multiple transceivers are moved as a sheet and tested without further handling so that rapid testing is feasible and delays for physical alignment of the transceivers within the fixture is minimized.

According to another aspect, near-field testing is used to eliminate the need for large chambers.

According to another aspect of such a test system, the transfer function of the antenna and detector portion of a transceiver receiver is tested.

The present invention is practiced according to a method in one embodiment which includes the steps of providing an enclosure that admits a sheet of transceivers, each transceiver formed within a respective region of the sheet, closing the enclosure to form an RF seal about each respective region, and operating each transceiver for receiving and transmitting signals.

According to a first aspect of such a method, independent testing of individual transceivers is accomplished for in-sheet transceivers and multiple transceivers are tested simultaneously.

According to another aspect, far-field tests are used to confirm the test signal used in manufacturing tests.

A method, in an alternate embodiment, for testing battery-operated transceivers includes the step of transmitting a wake up signal to a transceiver. According to a first aspect of such a method, only transceivers under test are made operational so that battery power is conserved in other transceivers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

A person having ordinary skill in the art will recognize where portions of a diagram have been expanded to improve the clarity of the presentation.

In each functional block diagram, a broad arrow symbolically represents a group of signals that together signify a binary code. For example, a group of bus lines is represented by a broad arrow because a binary value conveyed by the bus is signified by the signals on the several bus lines taken together at an instant in time. A group of signals having no binary coded relationship is shown as a single line with an arrow. A single line between functional blocks represents one or more signals.

DETAILED DESCRIPTION OF THE INVENTION

Figure 1:
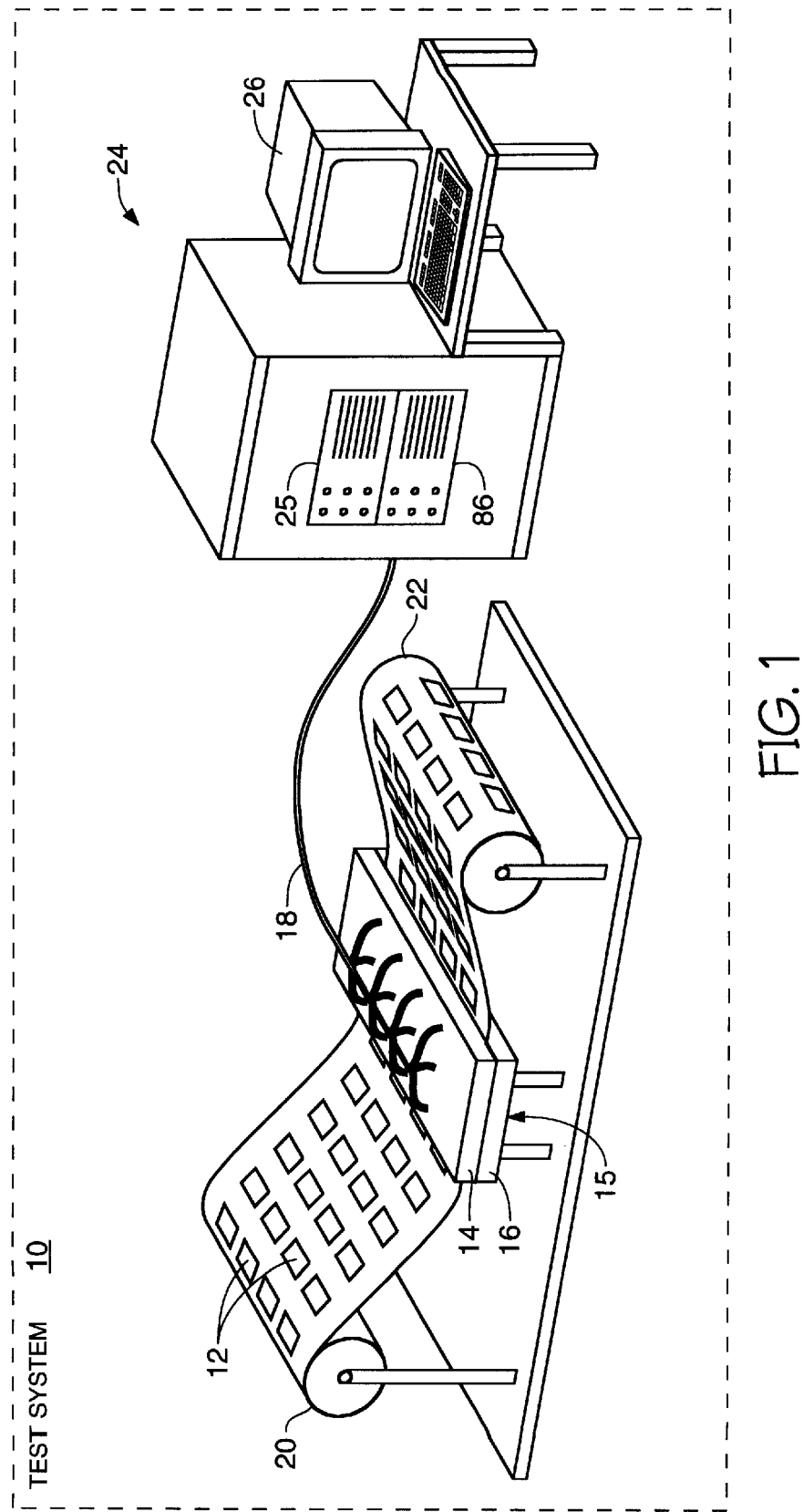
FIG. 1 is a plan view of a test system of the present invention.

FIG. 1 is a plan view of a test system of the present invention. Test system 10 provides manufacturing acceptance tests for an in-sheet transponder 12 provided on continuous roll 20 of laminated films. Transponders under test are located in fixture 15. Tested transponders are received on roll 22. Fixture 15 is connected by cable 18 to subsystem 24 so that signals generated by instrumentation in subsystem 24 are coupled to fixture 15 and so that signals received in fixture 15 are coupled to instruments in subsystem 24 for analysis. Subsystem 24 includes interrogator 25 and computer 86, cooperating for signal generation and analysis. Fixture 15 is characterized, according to a method of the present invention, using a correlation to far-field testing. Characterization of a system, fixture, or circuit conventionally includes making measurements of characteristic features of its structure and operation.

Transponders to be tested in an alternate embodiment are provided to fixture 15 in separated sheets, each sheet having an array of rows and columns of transponders. For example in one embodiment, about 250 transponders are manufactured in a sheet measuring about 18 inches by about 24 inches.

Test system 10 also includes materials handling equipment, not shown, for supplying sheets or rolls of transponders for testing, for aligning transponders within fixture 15, and for receiving tested transponders for further manufacturing steps. In one embodiment, individual tested transponders are separated (singulated) from the sheet in which testing occurred and are provided on an adhesive backing for distribution as tape-and-reel components or ready-to-use articles such as baggage tags, inventory labels, or badges, to name a few feasible applications.

Roll 20 includes a plurality of identical transponders, such as transponder 12. Transponder 12 is a radio frequency identification (RFID) device of the type described in U.S. patent application Ser. No. 07/990,918 by Snodgrass et al. filed Dec. 15, 1992, incorporated herein by reference. In one embodiment, transponder 12 is about 1 inch square, includes a lithium battery, an integrated circuit transceiver, and an antenna packaged using thin film and lamination techniques.

Figure 2:
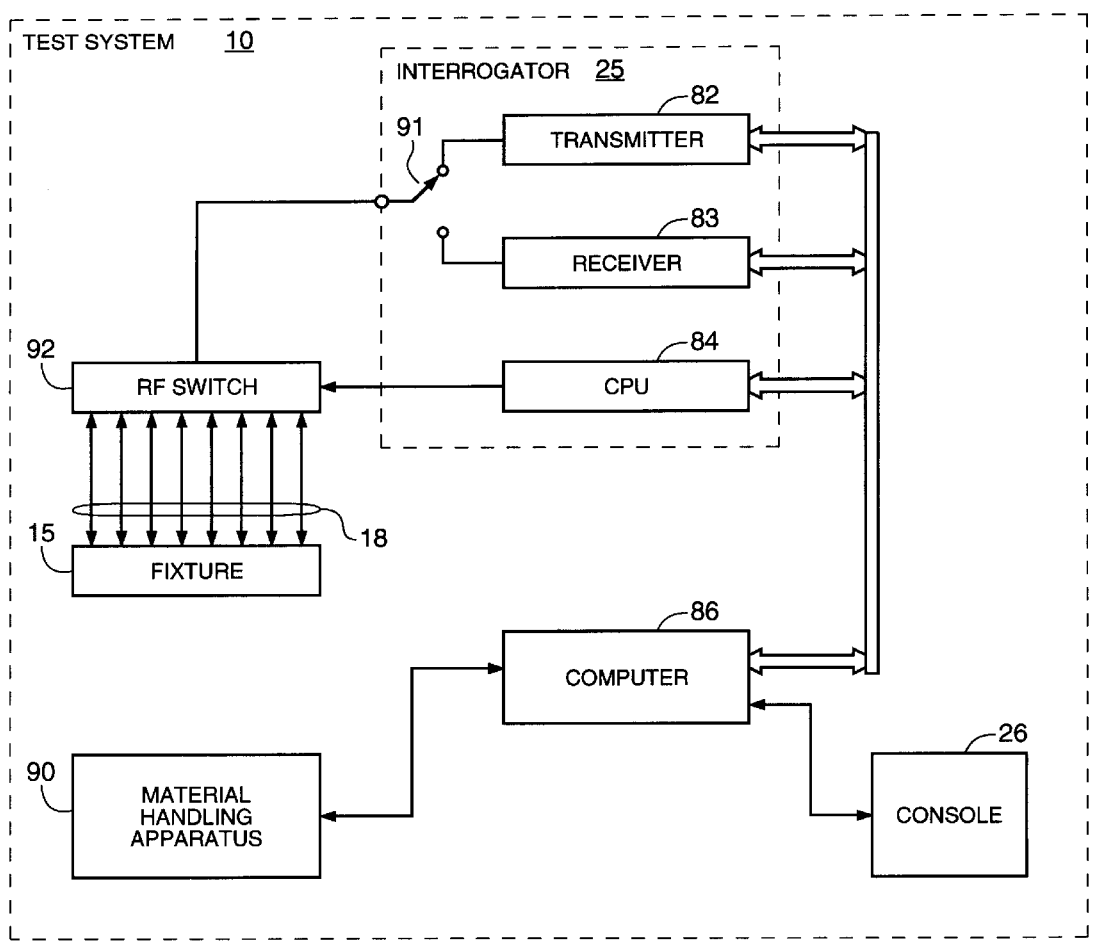
FIG. 2 is a functional block diagram of the test system of FIG. 1.

FIG. 2 is a functional block diagram of a test system of the present invention. Test system 10 includes six major functional elements: operator console 26, test system computer 86, interrogator 25, radio frequency (RF) switch 92, fixture 15, and material handling apparatus 90.

In operation, test system computer 86 directs material handling apparatus 90 to align a sheet of transponders (not shown) within fixture 15. Alignment assures that each transponder is isolated from other transponders in a manner to be discussed with reference to FIG. 4. In one embodiment, alignment includes automatic recognition by video camera of guide marks on the sheet and control of stepper motors according to software performed by computer 86 or in an alternate embodiment by a computer in material handling apparatus 90. One of ordinary skill will recognize that alignment includes the location of the fixture relative to the sheet so that the fixture, the sheet, or both can be repositioned to accomplish proper alignment.

When a sheet of transponders is aligned, computer 86 directs RF switch 92 for independently testing individual transponders. In a first embodiment, one transponder is tested at a time. In an alternate embodiment, multiple interrogators are coordinated to test multiple transponders simultaneously. Independent transponder operation during simultaneous testing of multiple transponders is accomplished in part by isolation provided by fixture 15.

During tests of each transponder, computer 86 directs interrogator 25, particularly interrogator central processing unit (CPU) 84, to generate and transmit via transmitter 82 command messages through switches 91 and 92, and to receive and interpret reply messages generated by that transponder that are conveyed through RF switch 92 and switch 91 to receiver 83. Interrogator 25 is of the type described in U.S. patent application Ser. No. 07/990,918 by Snodgrass et al. filed Dec. 15, 1992, incorporated herein by reference. Switch 91 and switch 92 are coax switches, common in the RF testing art. In alternate embodiments, switch 91 is eliminated and command and reply messages are separated by communication techniques known in the art, for example separation by time division or use of different frequency bands or different modulation techniques.

In one embodiment of the present invention, a test of the sensitivity of the receiver portion of the transceiver portion of a transponder under test includes transmitting from interrogator 25 a test signal, for example, a command message at a test power level. Transponders that fail to respond by transmitting a proper reply message fail the test at a first point. In another embodiment, the reply message includes a measurement of the signal strength seen by the receiver portion of the transponder under test. Transponders that report measurements of received signal strength that do not exceed an expected signal strength fail the test at a second point. By setting both test points as requirements, the population of tested transponders is of higher quality because marginal units are rejected. Therefore, the determination of the test power level and the expected signal strength are important to production and application economics.

Fixture 15 surrounds each transponder so that each transceiver's antenna is within one enclosure. In one embodiment, the enclosure surrounds an entire transponder and a small volume of ambient air so that the enclosure forms a cavity. In an alternate embodiment, only the transceiver's antenna is enclosed. In yet another alternate embodiment, the small volume is filled with potting material so that, for example, the cleanliness of the enclosure and the position of the antenna within the enclosure are maintained. In one embodiment, the potting material includes polyimide. In alternate embodiments, conventional potting materials and conventional materials used for films for encapsulating the transponder are used. The power level to be used for each enclosure depends on the materials and dimensions of the enclosure and the transponder.

To determine the test power level appropriate for one of several enclosures formed by fixture 15, far-field test results are correlated to conventional characterization tests of the transponder, potting material (if any), and the enclosure. By repeating characterization tests in each enclosure, a so called cavity transfer function relating test power level to received signal strength is determined for each enclosure of fixture 15.

Figure 3:
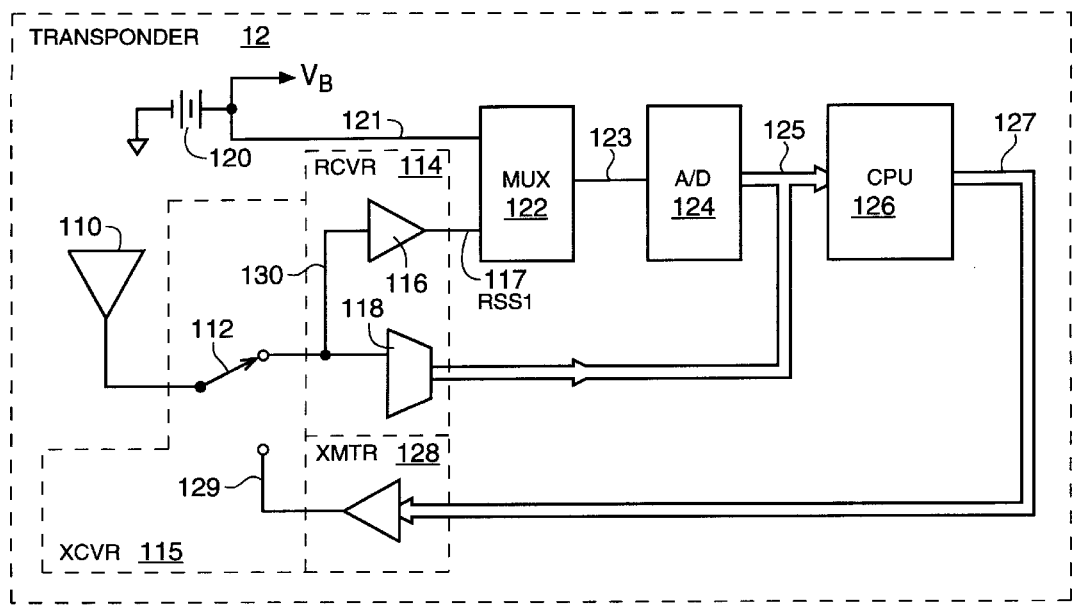
FIG. 3 is a functional block diagram of a transponder of the present invention to be tested in the test system of FIG. 1.

FIG. 3 is a functional block diagram of a transponder of the present invention to be tested in the test system of FIG. 1. Transponder 12 includes battery 120, antenna 110, transceiver 115, multiplexer 122, analog to digital (A/D) converter 124, and central processing unit (CPU) 126. Transceiver 115 includes transmit/receive switch 112, receiver 114, and transmitter 128. Transponder 12 operates from battery power provided by battery 120. All functional blocks are coupled to receive battery power signal $V_B$.

In operation, CPU 126 directs multiplexer 122 to select one of several analog signals for conversion. For example, when a report of battery voltage is desired, line 121 is selected and coupled to A/D converter 124. In response to a signal on line 123, A/D converter 124 provides a digital signal on line 125 to CPU 126. CPU 126 then forms a message signal on line 127 and directs transmission by transmitter 128 through switch 112 and antenna 110.

Except for antenna 110 and battery 120, the circuitry of transponder 12 is conventionally formed as an integrated circuit, manufactured in large number on a wafer. In a preferred test method of the present invention, some manufacturing acceptance tests are conducted after fabrication of a wafer containing perhaps a thousand independent integrated circuits. For example, the conversion accuracy of A/D converter 124 varies from wafer to wafer depending on variations in the fabrication process. Prior to forming dice from the wafer, all or a representative sample of A/D converters, are tested by introducing stimulus signals and obtaining response signals via wafer probes, as is well known in the art. Test results are generalized to determine an A/D transfer function relating signals 123 and 125 for the A/D converters on a particular wafer.

Operation of transponder 12 includes at least two modes of operation. In a first mode, power is conserved by disabling most transponder circuits. When a wake up signal is received by antenna 110, coupled to receiver 114 through switch 112, detected and demodulated by receiver circuit 118, and interpreted by CPU 126 as a proper wake up signal, transponder 12 enters a second mode of operation. In the second mode, power is applied to substantially all transponder circuitry for normal operation. In a preferred embodiment, the test signal is both a wake up signal and a request for a report of received signal strength.

Receiver 114 includes detector 116 for detecting received signal strength. Antenna 110 is coupled through switch 112 to convey an RF signal on line 130 to detector 116. Detector 116 provides on line 117 to multiplexer 122 signal RSS1 proportional to received signal strength. When a report of received signal strength is desired, line 117 is selected and signal RSS1 is coupled to A/D converter 124. In response to a signal on line 123, A/D converter 124 provides a digital signal on line 125 to CPU 126. CPU 126 then forms a message signal on line 127 and directs transmission by transmitter 128 through switch 112 and antenna 110.

Figure 4:
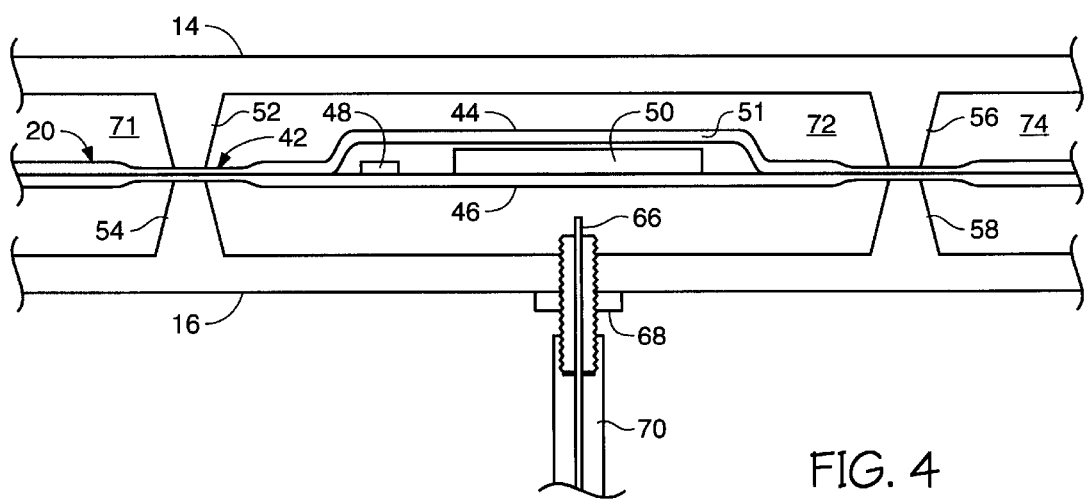
FIG. 4 is a cross sectional view of fixture 15.

FIG. 4 is a cross sectional view of fixture 15. Fixture 15 includes first section 14, second section 16, and an antenna in each enclosure (or cavity). For example, cavities 71, 72 and 74 are shown with antenna 66 in cavity 72. First section 14 includes a matrix of ridges, for example 52 and 56. Second section 16 includes a matching matrix of ridges, for example 54 and 58. Each pair of ridges for example 56 and 58 separates and defines adjacent cavities, for example cavities 72 and 74.

The upper surface of ridges 54 and 58 in second section 16 define a horizontal plane onto which a portion of roll 20 of laminated films is positioned. When that portion includes in-sheet transponders, material handling apparatus position the portion for in-sheet transponder testing. First section 14 and second section 16 are then pressed together against sheet 20 so that each transponder, for example transponder 51, is isolated from each other transponder in sheet 20. Ridges about each cavity form an RF seal.

The RF seal provides isolation. Isolation prevents RF energy radiated from antenna 66 in cavity 72 from interfering with tests conducted in adjacent cavity 74. The RF seal is not perfect and, therefore, isolation is not perfect, due to leakage for example between ridges 52 and 54 and between 56 and 58. Since leakage RF energy must pass through films 44 and 46, conventional shielding in the neighborhood of the contact between adjacent ridges is effective to further reduce leakage and thereby improve isolation. Such shielding includes placement of conductors and conductive materials within, between, and on the surfaces of films 44 and 46.

Isolation is operative to decouple an antenna in one enclosure from an antenna in an adjacent enclosure. From the point of view at antenna 66, when a signal originating in cavity 72 is stronger than a signal originating in cavity 74, for example, the signal sources and their respective antennas are considered decoupled from each other. Decoupling can also be accomplished by improving the gain of cavity 72, for example, by making its dimensions compatible with a wavelength of the signal originating in cavity 72.

In an alternate embodiment, first section 14 and second section 16 are fabricated as flat plates having no ridges 52, 54, 56, or 58. The distance between these plates is smaller than one wavelength of the signal originating in cavity 72 so that adjacent transponder antennas are effectively decoupled for purposes including manufacturing acceptance testing. In such an embodiment, first section 14 and second section 16 sandwich the sheet therebetween.

In a preferred embodiment, each transponder is formed within a square contour and each cavity has a matching square cross section so that transponders are isolated each one at its contour. In this sense, a contour extends through both films 44 and 46 to circumscribe one transponder. In a mathematical sense, a contour is defined on a surface. Since top film 44 has an upper surface, a first contour is defined on that top surface. Since bottom film 46 has a bottom surface, a second contour is defined on that bottom surface. The square cavity formed by ridges 54 and 58 in the second section is circumscribed by a third contour in the plane defined by the tops of the ridges on which the sheet is positioned. Thus, alignment includes positioning the sheet and the fixture so that the third contour formed on ridges 54 and 58 touches the sheet at the second contour on the bottom of film 46. When properly aligned, the first section, having a similar fourth contour on ridges 52 and 56, touches the first contour on the top of film 44. In a preferred embodiment, the first and second contours are directly opposed through the sheet. In alternate embodiments, ridges 52 and 54 touch film 44 along a sloped, concave, notched, or stepped surface for greater isolation. In such embodiments, important contours are not necessarily directly opposed.

Transponder 51 is identical to transponder 12 as previously described. Transponder 51 is of the type described as an enclosed transceiver in U.S. patent application Ser. No. 08/123,030, filed Sep. 14, 1993, incorporated herein by reference. The cross-sectional view of transponder 51 shows integrated circuit 48 and battery 50 between film 44 and film 46. Integrated circuit 48 includes the transceiver circuitry of transponder 51. Battery 50, in one embodiment, includes a metal surface coupled to operate as part of the antenna for the transceiver circuitry. Additional conductive traces on film 44 and film 46 cooperate for coupling battery power to integrated circuit 48 and for operation as part of the antenna for the transceiver. Films 44 and 46 are sealed to each other around a contour that encircles integrated circuit 48 and battery 50. In one embodiment, the seal is made by embossing so that the thickness of films 44 and 46 is reduced as shown at seal 42. After testing, transceiver 51 is separated from the sheet by cutting through films 44 and 46 at a point outside seal 42 so that transceiver 51 remains sealed after testing.

The central internal conductor of coax cable 70 is extended into cavity 72 for operation as a near-field antenna. Feed through fitting 68 holds coax cable 70 onto second section 16, shields the central conductor, and provides continuity of impedance from cable 70 up to antenna 66.

The amount of radiation coupled between antenna 66 and transponder 51 depends in part on several variables including the dimensions of cavity 72, the wavelengths of the radiated signals, potting or other materials (if any) within the enclosure, and the distance between antenna 66 and film 46. Although the location of transponder 51 is controlled by maintaining tension on sheet 20 as first section 14 is pressed against second section 16, these variables are expected to vary to some extent from cavity to cavity, from test to test, and over time with wear and handling of fixture 15 and operation and wear in materials handling apparatus used to position fixture 15, sheet 20, or both.

In a preferred embodiment, antenna 110 of transponder 12 is a square loop antenna for communication at about 2.45 gigahertz. The wavelength at that frequency is about 12.2 centimeters or about 4.82 inches. One of ordinary skill in the art will understand that cavity dimensions discussed above must lie outside the loop antenna. Conventional simulation may be used to arrive at sufficient or optimal dimensions of the cavity and sufficient or optimal dimensional characteristics of the antenna, including its placement and type (dipole, loop, stub, Marconi, etc).

According to a method of the present invention, the magnitude of signal 117 as shown in FIG. 3 is determined so that the effect of variation in the variables discussed above is removed from transponder test results and the pass rate for tested transponders is improved. Such a method begins with a first step of characterizing the encapsulated transponder with far-field tests. Before transponder 51 is tested in fixture 15, the digitization transfer function for analog to digital converter 124 shown in FIG. 3 is determined in a second step. As with the first step, in this second step, a desired level of accuracy for manufacturing acceptance tests is achieved using one of several approaches including design simulation, theoretical analysis, tests of a prototype, tests of representative samples, or tests of every transponder. In a preferred embodiment, sufficient accuracy is obtained for a manufacturing lot of transponders by conducting wafer probe tests for the second step.

In a third step, the cavity is characterized by design simulation, theoretical analysis, or conventional tests.

Fourth, a prototype or representative transponder 51 is placed in the cavity shown in FIG. 4 that was characterized in the third step. In a fifth step, a pass/fail test power level and the expected reported signal strength are determined by analysis of the results of tests made with the representative transponder, the characterization data, and the results of simulation and other techniques known in the art. Together the process of determining in this fifth step is defined as correlating far-field measurements with transceiver responses.

After test power level and response data are determined, manufacturing acceptance testing can proceed by replacing the representative transponder with an untested transponder 51. While in the cavity and isolated from other transponders, several tests are performed including a receiver sensitivity test.

A receiver sensitivity test of the present invention includes the following steps: radiating a test signal from antenna 66; converting analog signal RSS1 received by antenna 110 to a digital result on line 125; transmitting, by means of transmitter 128 and antenna 110, a message conveying the digital result; receiving the message via antenna 66; and making a pass/fail determination based on the response (if any) from the untested transponder. As one result, defects in antenna 110, switch 112, and receiver circuit 118 are made apparent.

The foregoing description discusses preferred embodiments of the present invention, which may be changed or modified without departing from the scope of the present invention.

For example, the orientation and shape of fixture 15 as two plates as shown in FIGS. 1 and 4 in alternate and equivalent embodiments are modified for cooperation with material handling apparatus, not shown. In one such modified orientation, the plane at which first section 14 and second section 16 meet is vertical rather than horizontal. In one such modified shape, the fixture has a spherical shape (rather than generally hexahedral), each contour surrounding a transponder is circular (rather than square), and each cavity is spherical (rather than generally hexahedral). In other embodiments, antenna 66 is located in various positions including, for example, in an opposite section of a cavity, within a ridge, in an adjoining cavity not completely isolated by ridges, or (for multiple antennas per cavity) at several of these locations.

Still further, those skilled in the art will understand that first section 14, second section 16, or both in alternate and equivalent embodiments are formed along an axis of turning to permit advancing a portion of sheet 20 as a portion of the fixture turns about its axis. In one embodiment, such movement moves and aligns sheet 20.

In a preferred embodiment, a microwave frequency band is used for transponder communication. The same band is used for transponder testing. In alternate embodiments that a person skilled in the art with knowledge of the teachings of the present invention would recognize as equivalents, another one or more frequency bands are utilized.

As still another example, the complexity of transponder 12 shown in FIG. 3 in alternate embodiments is simplified. Without departing from the scope of the present invention, for example, transmitter 128 is replaced with a transmitter responsive to an analog instead of a digital input, receiver circuit 118 is replaced with a circuit providing an analog rather than a digital output, analog to digital converter 124 is eliminated and CPU 126 is replaced with an analog rather than a digital circuit.

These and other changes and modifications known to those of ordinary skill are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to rack and panel instrumentation, a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents.

A "signal" refers to mechanical and/or electromagnetic energy conveying information. When elements are coupled, a signal is conveyed in any manner feasible with regard to the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "magnitude" or "value." The measure may be instantaneous or an average.

What is claimed is:

1. A method for a test fixture system to test the sensitivity of an RF transponder, comprising the steps of:
   a) a test fixture system transmitting a first RF signal to an RF transponder;
   b) the transponder receiving the first RF signal and detecting the value of the strength of the received signal;
   c) the transponder producing a multiple-bit digital representation of the detected signal strength value; and
   d) the transponder transmitting a second RF signal containing a message conveying the multiple-bit digital representation of the value of the received signal strength measurement.

2. A method according to claim 1, further comprising the steps of:
   a) the test fixture system receiving the second RF signal; and
   b) the test fixture system identifying the transponder as defective depending on the value conveyed in the message contained in the second RF signal.

3. A system for testing the RF sensitivity of an RF transponder, comprising:
   an RF test fixture that transmits a first RF signal; and
   an RF transponder including
      a) an antenna for receiving the first RF signal,
      b) a signal strength measurement circuit, connected to the antenna, for producing a multiple-bit digital representation of the strength of the received RF signal, and
      c) a transmitter circuit for transmitting a second RF signal containing a message conveying the multiple-bit digital representation of the received signal strength.

4. A system according to claim 3, wherein the signal strength measurement circuit comprises:
   a) a detector for detecting the signal strength of the received RF signal and for producing an analog output signal proportional to the signal strength; and
   b) an analog-to-digital converter having an analog input and a multiple-bit digital output, the analog input being connected to receive the detector output signal, wherein the converter produces at its output a multiple-bit digital representation of the value of the detector output.

5. A system according to claim 3, wherein the RF test fixture further comprises:
   a receiver circuit for receiving the second RF signal; and
   a circuit for identifying the transponder as defective depending on the value conveyed in the message contained in the second RF signal.

* * * * *